United States Patent
Kwack et al.

(10) Patent No.: US 8,519,621 B2
(45) Date of Patent: Aug. 27, 2013

(54) ORGANIC LIGHT EMITTING DISPLAY AND METHOD FOR MANUFACTURING THE SAME

(75) Inventors: Jin-Ho Kwack, Suwon-si (KR);
Jong-Han Jeong, Suwon-si (KR);
Dong-Won Han, Suwon-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 781 days.

(21) Appl. No.: 11/769,392

(22) Filed: Jun. 27, 2007

(65) Prior Publication Data

US 2008/0180022 A1    Jul. 31, 2008

(30) Foreign Application Priority Data

Jan. 30, 2007    (KR) .................. 10-2007-0009702

(51) Int. Cl.
*H01L 51/00*    (2006.01)
*H01L 51/50*    (2006.01)
*H01L 51/52*    (2006.01)
*H01L 51/54*    (2006.01)

(52) U.S. Cl.
USPC ............ 313/512; 313/504; 313/506; 313/509

(58) Field of Classification Search
USPC ................................. 313/498–512
See application file for complete search history.

(56) References Cited

U.S. PATENT DOCUMENTS

| | | | |
|---|---|---|---|
| 5,258,690 A | 11/1993 | Leksell et al. | |
| 5,811,177 A * | 9/1998 | Shi et al. | 428/209 |
| 7,417,367 B2 * | 8/2008 | Erchak | 313/498 |
| 7,452,738 B2 * | 11/2008 | Hayashi et al. | 438/29 |
| 8,026,511 B2 * | 9/2011 | Choi et al. | 257/40 |
| 2003/0164677 A1 * | 9/2003 | Miyaguchi et al. | 313/504 |
| 2004/0069017 A1 * | 4/2004 | Li et al. | 65/43 |
| 2005/0053719 A1 * | 3/2005 | Ishida | 427/66 |
| 2005/0088088 A1 * | 4/2005 | Yamazaki | 313/512 |
| 2005/0110020 A1 * | 5/2005 | Hayashi et al. | 257/72 |

(Continued)

FOREIGN PATENT DOCUMENTS

| | | |
|---|---|---|
| JP | 09-204981 A | 8/1997 |
| JP | 2004-342515 | 2/2004 |

(Continued)

OTHER PUBLICATIONS

Notice of Allowance which was issued on Dec. 14, 2007 in corresponding Korean patent application No. 10-2007-0009702 in 2 pages.

*Primary Examiner* — Anne Hines
*Assistant Examiner* — Jose M Diaz
(74) *Attorney, Agent, or Firm* — Knobbe Martens Olson & Bear LLP

(57) ABSTRACT

Disclosed is an organic light emitting display and a method for manufacturing the same capable of preventing external moisture or oxygen from being penetrated into an organic light emitting diode. In particular, disclosed is an organic light emitting display comprising an organic light emitting diode array comprising a light emitting diode formed over a substrate and an organic emission layer between a first electrode and a second electrode, a sealing cover comprising at least one organic film and at least one inorganic film, and a sealing material formed along an edge of the sealing cover for sealing a boundary of the substrate and the sealing cover and a boundary of the organic film and the inorganic film of the sealing cover.

11 Claims, 2 Drawing Sheets

(56) References Cited

U.S. PATENT DOCUMENTS

| | | | |
|---|---|---|---|
| 2005/0179049 A1* | 8/2005 | Ho | 257/100 |
| 2005/0181235 A1* | 8/2005 | Kobayashi | 428/690 |
| 2005/0211994 A1* | 9/2005 | Erchak | 257/79 |
| 2005/0227082 A1* | 10/2005 | Shimazu et al. | 428/413 |
| 2006/0088951 A1* | 4/2006 | Hayashi et al. | 438/99 |
| 2006/0220551 A1* | 10/2006 | Yamazaki | 313/512 |
| 2006/0262267 A1* | 11/2006 | Sekiguchi | 349/187 |
| 2006/0284556 A1* | 12/2006 | Tremel et al. | 313/512 |
| 2007/0042189 A1* | 2/2007 | Shirai et al. | 428/411.1 |
| 2007/0090759 A1* | 4/2007 | Choi et al. | 313/512 |
| 2007/0170839 A1* | 7/2007 | Choi et al. | 313/500 |
| 2007/0170849 A1* | 7/2007 | Park | 313/506 |
| 2007/0170857 A1* | 7/2007 | Choi et al. | 313/512 |
| 2007/0170861 A1* | 7/2007 | Lee et al. | 313/512 |
| 2008/0018230 A1* | 1/2008 | Yamada et al. | 313/498 |
| 2008/0054785 A1* | 3/2008 | Hayashi | 313/483 |
| 2009/0167155 A1* | 7/2009 | Kwak | 313/504 |

FOREIGN PATENT DOCUMENTS

| | | |
|---|---|---|
| JP | 2006-196466 | 7/2006 |
| KR | 10-2004-0054829 | 6/2004 |
| KR | 10-2005-0006558 | 1/2005 |
| KR | 10-2006-0093755 | 8/2006 |
| WO | WO 2005105428 A1 * | 11/2005 |

* cited by examiner

ORGANIC LIGHT EMITTING DISPLAY AND METHOD FOR MANUFACTURING THE SAME

CROSS-REFERENCE TO RELATED APPLICATIONS

This application claims the benefit of Korean Patent Application No. 10-2007-0009702, filed on Jan. 30, 2007, in the Korean Intellectual Property Office, the disclosure of which is incorporated herein by reference.

BACKGROUND

1. Field

The present disclosure relates to an organic light emitting display and a method for manufacturing the same.

2. Discussion of Related Technology

An organic light emitting display is a type of flat panel display which can emit light by using energy discharged while an excited molecule is returning to the ground state by locating the organic light emitting layer between the two electrodes and applying voltages to the two electrodes. The excited molecule is preferably generated when a hole and an electron, which are introduced from two opposite electrodes to an organic light emitting layer, are engaged.

The organic light emitting display is gaining recognition as the next generation display because it has excellent visibility, can be light-weight and slim, and can be driven with a low voltage. However, the emission layer of an organic light emitting diode can become damaged when it is exposed to moisture or oxygen. Accordingly, so as to prevent damage to the organic light emitting diode due to the moisture or oxygen, an aspect of the present invention includes a sealing means formed on a substrate on which the organic light emitting diode is formed. The substrate may be made in multiple layers, any of which may have circuitry formed thereon. The sealing means may include a sealing substrate and/or a sealing cover.

In conventional designs, the sealing substrate may be formed of glass or metal. A peripheral region of the sealing substrate is coated with an adhesive member, and the resulting object is adhered to a substrate. Next, UV light can be irradiated to the sealing substrate coated with the adhesive member to cure the adhesive member. However, a sealing substrate formed of the glass or metal is not suitable to be used in an organic light emitting display, which uses a flexible substrate or a slimmed substrate. The foregoing discussion is only to provide background information relating to the invention disclosed in this application and does not constitute an admission of prior art.

SUMMARY

One aspect of the invention provides an organic light emitting display comprising a substrate, an organic light emitting diode array including a light emitting diode formed at a pixel region of the substrate, a sealing cover, comprising at least one organic film and at least one inorganic film, laminated to the organic light emitting diode array, and a sealing material formed along an edge of the sealing cover. The sealing material can seal one or more of the boundaries between the substrate and the sealing cover and one or more of the boundaries between the organic film and the inorganic film of the sealing cover. As used herein, the term boundary is used to identify the interface between the various layers of material, including but not limited to the interface between the various layers of organic film and inorganic film and between the substrate and the organic film and the interface between the substrate and the sealing cover. The organic light emitting diode array preferably has a light emitting diode formed at a pixel region of the substrate and an organic emission layer between a first electrode and a second electrode of the light emitting diode. Furthermore, the substrate may include a pixel region and a non-pixel region formed at the periphery of the pixel region The sealing material may, but is not required to, cover at least a part of the non-pixel region on the sealing cover. The sealing material may be an organic material such as, but not limited to, a thermosetting resin. Alternatively, the sealing material may be an inorganic material such as, but not limited to, a frit. The frit may include, but is not limited to, one or more compounds from the group consisting of $K_2O$, $Fe_2O_3$, $Sb_2O_3$, $ZnO$, $P_2O_5$, $V_2O_5$, $TiO_2$, $Al_2O_3$, $WO_3$, $SnO$, $PbO$, $MgO$, $CaO$, $BaO$, $Li_2O$, $Na_2O$, $B_2O_3$, $TeO_2$, $SiO_2$, $Ru_2O$, $Rh_2O$, $CuO$, or $Bi_2O_2$.

Also, the sealing cover may have a thickness ranging from about 1 to about 10 μm. The organic film of the sealing cover may be selected from, but is not limited to, any one or more of the group comprised of epoxy, acrylate, or urethaneacrylate. The inorganic film of the sealing cover may be selected from, but is not limited to, any one or more of the group comprised of $Al_xO_y$ or $Si_xO_y$, where the subscripts x and y are integers.

Further, the sealing cover may include an organic film and an inorganic film, which are alternately laminated. Another aspect of the present invention provides the organic light emitting display described above wherein the sealing cover includes five organic films and five inorganic films which are alternately laminated. The organic light emitting display described above may further comprise a thin passivation layer formed on a cathode electrode of the organic light emitting diode array. In this configuration, the sealing cover is preferably laminated to the organic light emitting diode array after the thin passivation layer has been formed on the cathode electrode.

Another aspect of the invention involves a method for manufacturing an organic light emitting display, comprising the steps of providing an unfinished device comprising a substrate comprising a pixel region and a non-pixel region formed at a periphery of the pixel region and an organic light emitting diode array including a light emitting diode formed at the pixel region of the substrate and having an organic emission layer between a first electrode and a second electrode, forming a sealing cover including at least one organic film and at least one inorganic film which are laminated on the organic light emitting diode array to cover the light emitting diode of the substrate, applying a sealing material along an edge of the sealing cover for sealing a boundary of the substrate and the sealing cover and a boundary of the organic film and the inorganic film of the sealing cover, and curing the sealing material. The sealing material may be coated by a dispensing or screen printing method. The curing may be performed by a laser beam, heat, UV, or other similar methods. If formed by the laser method, the laser would preferably have a wavelength ranging from 800 nm to 1200 nm.

BRIEF DESCRIPTION OF THE DRAWINGS

The above-mentioned and other features of the inventions disclosed herein are described below with reference to the drawings of various embodiments. The illustrated embodiments are intended to illustrate, but not to limit the inventions. The drawings contain the following Figures:

FIG. 3b is a cross-sectional view of the organic light emitting display illustrated in FIG. 3a taken along line A-A' of FIG. 3a.

DETAILED DESCRIPTION OF EMBODIMENTS

Hereinafter, various embodiments according to the present invention will be described with reference to the accompanying drawings. It is to be understood that, when an element of the present invention is described to be couped to a second element, the first element may not only be directly couped to the second element, but it may also be indirectly couped to the second element via another element, or it may be couped to other elements altogether. Further, items or structures not necessary to the understanding of the present invention have been omitted from the Figures and description herein for purposes of enhancing the clarity of this disclosure.

Figure 1:
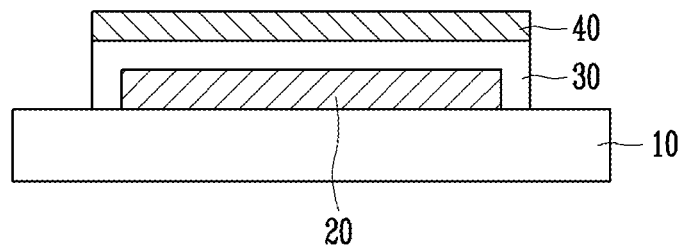
FIG. 1 is a cross-sectional view showing an organic light emitting display according to the related art.

FIG. 1 is a cross-sectional view showing a sealing cover for covering an organic light emitting diode according to the related art. With reference to FIG. 1, a conventional organic light emitting display may include a substrate 10, an organic light emitting diode array 20, an organic thin film 30, and an inorganic thin film 40. The substrate may include a pixel region as well as a non-pixel region formed at a periphery of the pixel region (not shown). The organic light emitting diode array may be formed at the pixel region of the substrate, and may include an organic emission layer formed between a first electrode and a second electrode. The sealing cover may be formed by alternately laminating an organic film 30 and an inorganic film 40 so as to prevent moisture or oxygen from penetrating into an organic light emitting diode.

However, in aspects of the organic light emitting display of the prior art, oxygen or moisture can penetrate the organic light emitting diode at the boundary between the substrate and the sealing cover and also at the boundary between the organic film and the inorganic film of the sealing cover. This can cause damage to the organic light emitting diode.

Figure 2:
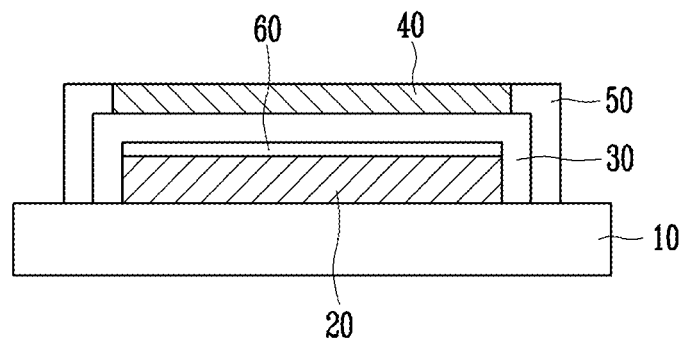
FIG. 2 is a cross-sectional view showing an organic light emitting display according to an embodiment of the present invention.

FIG. 2 is a cross-sectional view showing an organic light emitting display according to a first embodiment of the present invention. The embodiment of the organic light emitting display illustrated in FIG. 2 includes a substrate 10, an organic light emitting diode array 20, a sealing cover that consists of an organic film 30 and an inorganic film 40, and a sealing material 50. The substrate 10 may be made in multiple layers, any of which may have circuitry formed thereon. The substrate 10 may include a pixel region and a non-pixel region. The pixel region is a region that displays predetermined images due to light emitted from the organic light emitting diode. The non-pixel region may be formed at a peripheral portion of the pixel region and, as the term is used herein, represents all regions on the substrate 10 except for the pixel region. Thus, the organic light emitting diode array 20 may be formed at the pixel region of the substrate 10. The organic light emitting diode array 20 includes an organic light emitting diode that may have an organic emission layer formed between a first electrode and a second electrode.

The organic light emitting diode array 20 can include at least one organic light emitting diode, which has an anode electrode, a cathode electrode, and an emission layer (not shown). The anode electrode of the organic light emitting diode can be electrically couped to a drain electrode of a thin film transistor. The thin film transistor can be formed at a lower surface of an opening of a pixel definition film. The cathode electrode can be formed on the emission layer and the pixel definition film. The emission layer can be laminated on an upper portion of the anode electrode.

When a predetermined voltage is applied to the anode electrode and the cathode electrode, holes injected from the anode electrode are transported to the emission layer through a hole transport layer forming the emission layer. Further, electrons injected from the cathode electrode are injected to the emission layer through an electron transport layer. At this time, the electrons and holes are recombined with each other at the emission layer to generate an exciton. As the exciton changes from an excited state to a ground state, a phosphorous molecule of the emission layer emits light to form images.

Further, the organic light emitting diode array 20 can further include a thin passivation layer 60 in order to prevent external oxygen or moisture from penetrating and damaging the cathode electrode. The thin passivation layer 60 protects a cathode electrode of an organic light emitting diode.

In the embodiment illustrated in FIG. 2, the sealing cover preferably includes an organic film 30 and an inorganic film 40 for sealing at least a pixel region on the substrate 10. The organic film 30 and the inorganic film 40 are alternately laminated in order to prevent moisture or oxygen from penetrating into the organic light emitting diode array 20. The sealing cover may have a thickness ranging from about 1 to about 10 μm. A sealing substrate in a general organic light emitting display may have a thickness greater than 200 μm. The organic film 30 of the sealing cover may be, but is not required to be, selected from the group consisting of epoxy, acrylate, or urethaneacrylate. The inorganic film of the sealing cover may be, but is not required to be, one selected from the group consisting of $Al_xO_y$ or $Si_xO_y$, where the subscripts x and y are integers.

The sealing material 50 may be comprised of an organic or inorganic material. The sealing material 50 may be formed to seal a boundary between the substrate 10 and the sealing cover, which consists of the organic film 30 and the inorganic film 40, and the boundary between the organic film 30 and the inorganic film 40 of the sealing cover. The sealing material 50 prevents moisture or oxygen from penetrating between the substrate 10 and the sealing cover and from penetrating between the organic film 30 and the inorganic film 40 of the sealing cover.

The organic material of the sealing material 50 may be a thermosetting resin or a UV thermosetting resin. The thermosetting resin is a resin that is hardened when heat is applied thereto. When the thermosetting resin is heated during the forming processes, a chemical reaction occurs. This chemical reaction causes cross-links to form in the thermosetting resin, which cause the thermosetting resin to permanently harden and set.

The inorganic material of the sealing material 50 may be a frit comprising fine particles of reined glass. The frit preferably includes at least one compound selected from the group consisting of $K_2O$, $Fe_2O_3$, $Sb_2O_3$, $ZnO$, $P_2O_5$, $V_2O_5$, $TiO_2$, $Al_2O_3$, $WO_3$, $SnO$, $PbO$, $MgO$, $CaO$, $BaO$, $Li_2O$, $Na_2O$, $B_2O_3$, $TeO_2$, $SiO_2$, $Ru_2O$, $Rh_2O$, $CuO$, or $Bi_2O_2$. The fine particles of the frit have a size ranging from 2 to 30 μm.

Furthermore, the frit can include injection material or other additional material. The injection material or other additional material preferably adjusts the composite material to have a unique thermal expansion value. More particularly, the frit preferably includes injection material or additional material having transition element metals such as Cr. Fe, Mn, Co, or Cu, which can adjust the thermal expansion coefficient of the frit. After a solvent is added and coated to the frit along an edge of the sealing cover, which is in a paste state, it is cured so that the frit can be formed in a desired pattern at a desired position. Ethyl cellulose, nitro cellulose, hydroxide propyl cellulose may be used for this process.

Figure 3A:
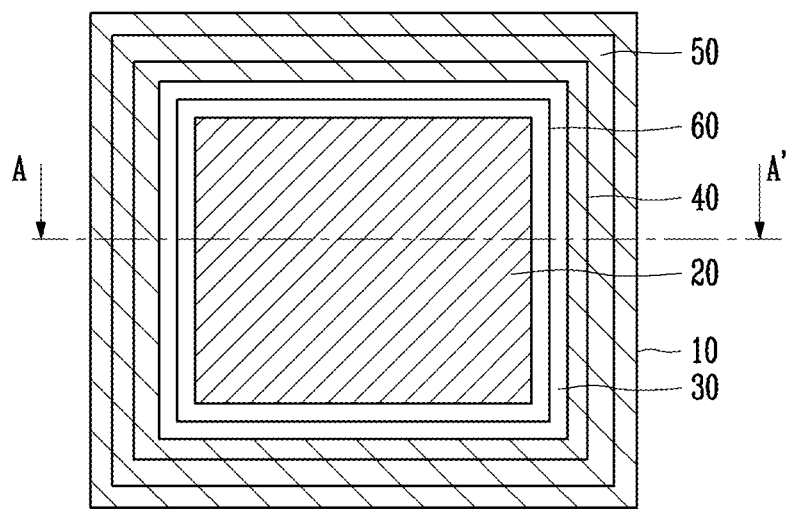
FIG. 3a is a plan view showing an organic light emitting display according to another embodiment of the present invention.
Figure 3B:
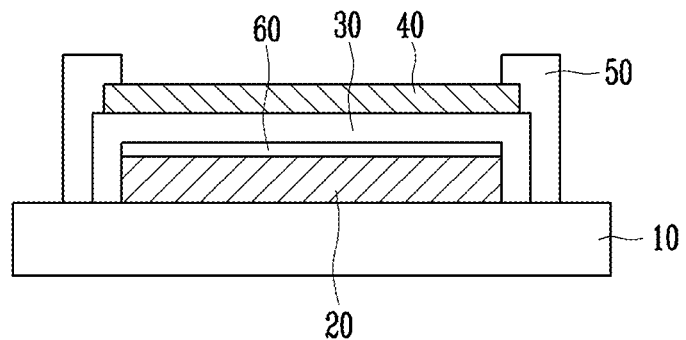

FIG. 3a is a plan view showing an organic light emitting display according to another embodiment of the present invention. FIG. 3b is a cross-sectional view of the organic light emitting display taken along line A-A' of FIG. 3a. The organic light emitting display according to the embodiment illustrated in FIGS. 3a and 3b has substantially the same constructions and functions as those of the organic light emitting display according to the first embodiment. The range of the coating region of the sealing material 50 can vary. The coating region of the sealing material 50 can seal only the boundary between the substrate 10 and the sealing cover (i.e., the alternating layers consisting of the organic film 30 and the inorganic film 40) and/or the boundary between the organic film 30 and the inorganic film 40 of the sealing cover. The coating region of the sealing material 50 can alternatively cover all surfaces except the pixel region on the substrate, that is, all surfaces except for a region designed to display predetermined images due to light emitted from an organic light emitting diode. As illustrated in FIGS. 3a and 3b, the sealing material 50 does not penetrate the pixel region. This avoids size limitations of a display screen of the organic light emitting display type that may otherwise occur.

Figure 4:
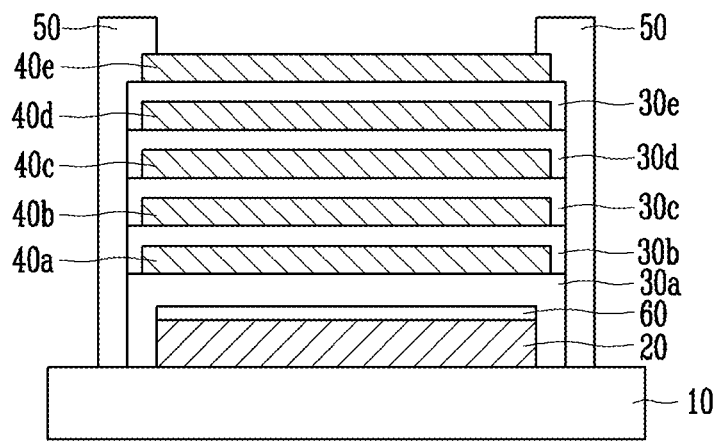
FIG. 4 is a cross-sectional view showing an organic light emitting display according to a further embodiment of the present invention.

FIG. 4 is a cross-sectional view showing an organic light emitting display according to a further embodiment of the present invention. As shown in FIG. 4, the organic light emitting display has substantially the same construction and function as the organic light emitting display according to the second embodiment. The difference is that there are five each of the organic film 30 and the inorganic film 40, alternately disposed. These additional films may further enhance the effectiveness of preventing external moisture or oxygen from penetrating the organic light emitting diode array 20.

Similar to the first embodiment of the present invention, the sealing material 50 can be formed to seal the boundary of the substrate 10 and the sealing cover, which consists of the multiple layers of organic film 30 and inorganic film 40, as well as the boundary of the organic film 30 and inorganic film 40 of the sealing cover. Otherwise, as in the second embodiment of the present invention, the sealing material 50 may be formed to cover all surfaces except the surface defined by the pixel region.

A preferred method for manufacturing the organic light emitting display will now be described. The first step of the method for manufacturing the organic light emitting display may involve preparing the substrate. Here, the substrate may include a pixel region as well as a non-pixel region formed at a peripheral portion of the pixel region. An organic light emitting diode array is formed on the pixel region. The organic light emitting diode array can include an organic light emitting diode having an organic emission layer formed between a first electrode and a second electrode. Next, a thin passivation layer can be formed on a cathode electrode of the organic light emitting diode array to sufficiently cover the cathode electrode. Subsequently, a sealing cover may be formed to cover the organic light emitting diode of the substrate. The sealing cover may be formed by sequentially laminating respective layers consisting of an organic film and an inorganic film. Thereafter, a sealing material may be applied to seal the boundary between the substrate and the sealing cover as well as the boundary of the organic film and the inorganic film of the sealing cover, along an edge of the sealing cover. Such a sealing material may be formed by a dispensing or screen printing method.

In the dispensing method, when forming a sealing material at an upper portion of the sealing cover, after the sealing cover is coated with the sealing material to have a predetermined shape and amount using a nozzle, the resulting object is preferably cured by a laser beam or by UV methods of the type commonly practiced in the art.

Furthermore, in the screen printing method, upon forming the sealing material, impurities at an upper portion of the sealing cover are preferably removed. Next, the surfaces that are not desired to be coated are masked. The remaining surfaces may be coated with the sealing material, and the sealing material may be squeezed by a squeeze machine. The resulting structure is cured by using UV light, by heating the structure to between approximately 400° C. to 600° C., or by applying a laser beam having a wavelength of approximately 800 nm to approximately 1200 nm. When the sealing material is an organic material, it is preferable to cure the sealing material by applying heat or UV light. Alternatively, when the sealing material is an inorganic material, it is preferable to cure the sealing material by using a laser. When performing the screen printing method, a coated surface has a flat shape, the thickness of the coated surface is small, and the coated surface easily adheres to the sealing cover.

Although these inventions have been disclosed in the context of certain preferred embodiments and examples, it will be understood by those skilled in the art that the present inventions extend beyond the specifically disclosed embodiments to other alternative embodiments and/or uses of the inventions and obvious modifications and equivalents thereof In addition, while several variations of the inventions have been shown and described in detail, other modifications, which are within the scope of these inventions, will be readily apparent to those of skill in the art based upon this disclosure. It is also contemplated that various combination or sub-combinations of the specific features and aspects of the embodiments may be made and still fall within the scope of the inventions. It should be understood that various features and aspects of the disclosed embodiments can be combined with or substituted for one another in order to form varying modes of the disclosed inventions. Thus, it is intended that the scope of at least some of the present inventions herein disclosed should not be limited by the particular disclosed embodiments described above.

For example, the range of coverage of the sealing material may be such that it is limited to only the boundary between an organic film and an inorganic film. However, it may also extend to a side surface of the substrate.

What is claimed is:

1. An organic light emitting display comprising:
an organic light emitting diode array comprising a light emitting diode formed over a substrate and an organic emission layer between a first electrode and a second electrode;
a sealing cover comprising at least one organic film and at least one inorganic film; and
a sealing material formed along an edge of the sealing cover for sealing a boundary of the substrate and the sealing cover and for further contacting the organic film and the inorganic film of the sealing cover, wherein the sealing material is in contact with the substrate and sealing cover and comprises a frit.

2. The organic light emitting display as claimed in claim 1, wherein at least one of said organic film and inorganic film contacts the organic light emitting diode array.

3. The organic light emitting display as claimed in claim 1, further comprising a passivation layer formed on one of the first and second electrodes of the organic light emitting diode array.

4. The organic light emitting display as claimed in claim 3, wherein at least one of said organic film and said inorganic film contacts said passivation layer.

5. The organic light emitting display as claimed in claim 1, wherein the organic film of the sealing cover comprises at least one material selected from the group consisting of epoxy, acrylate, and urethaneacrylate.

6. The organic light emitting display as claimed in claim 1, wherein the inorganic film of the sealing cover comprises at least one material selected from the group consisting of $Al_xO_y$, and $Si_xO_y$, where x and y are integers.

7. The organic light emitting display as claimed in claim 1, wherein the sealing cover comprises two or more organic films and two or more inorganic films, wherein each of said two or more organic films is alternately disposed with each of said two or more inorganic films.

8. The organic light emitting display as claimed in claim 1, wherein the sealing cover comprises five organic films and five inorganic films which are alternately disposed.

9. The organic light emitting display as claimed in claim 1, wherein the sealing cover has a thickness ranging from about 1 to about 10 μm.

10. The organic light emitting display as claimed in claim 1, wherein the frit comprises at least one material selected from the group consisting of: $K_2O$, $Fe_2O_3$, $Sb_2O_3$, ZnO, $P_2O_5$, $V_2O_5$, $TiO_2$, $Al_2O_3$, $WO_3$, SnO, PbO, MgO, CaO, BaO, $Li_2O$, $Na_2O$, $B_2O_3$, $TeO_2$, $SiO_2$, $Ru_2O$, $Rh_2O$, CuO, and $Bi_2O_2$.

11. The organic light emitting display as claimed in claim 1, wherein the sealing material generally surrounds the organic light emitting diode array.

* * * * *